(12) United States Patent
Hess et al.

(10) Patent No.: US 11,259,434 B2
(45) Date of Patent: Feb. 22, 2022

(54) MODULE ARRANGEMENT WITH RESETTING MECHANISM

(71) Applicants: TE Connectivity Germany GmbH, Bensheim (DE); ABB Schweiz AG, Baden (CH)

(72) Inventors: Karl-Heinz Hess, Heppenheim (DE); Andreas Herrmann, Mainz (DE); Mohamed Aboulkassem, Griesheim (DE); Thomas Hertzberg, Darmstadt (DE); Michael Hagemann, Darmstadt (DE); Peter Kraemer, Grasellenbach (DE); Markus Ofenloch, Burstadt (DE); Frank Zimmer, Darmstadt (DE); Andreas Symantzik, Ober-Ramstadt (DE); Thomas Keul, Freigericht (DE); Erik Wilhelm H. Hammarstrand, Vaesteras (SE)

(73) Assignees: TE Connectivity Germany GmbH, Bensheim (DE); ABB Schweiz AG, Baden (CH)

( * ) Notice: Subject to any disclaimer, the term of this patent is extended or adjusted under 35 U.S.C. 154(b) by 260 days.

(21) Appl. No.: 16/426,246

(22) Filed: May 30, 2019

(65) Prior Publication Data
US 2019/0281724 A1 Sep. 12, 2019

Related U.S. Application Data

(63) Continuation of application No. PCT/EP2017/078128, filed on Nov. 3, 2017.

(30) Foreign Application Priority Data

Nov. 30, 2016 (EP) .................................... 16201446

(51) Int. Cl.
*G06F 1/16* (2006.01)
*H05K 5/00* (2006.01)
(Continued)

(52) U.S. Cl.
CPC ......... *H05K 7/1468* (2013.01); *H05K 7/1455* (2013.01)

(58) Field of Classification Search
CPC .. H05K 7/1468; H05K 7/1455; H05K 7/1454; H05K 7/1452; H05K 7/1438;
(Continued)

(56) References Cited

U.S. PATENT DOCUMENTS 4,595,250 A * 6/1986 Joly ..................... H01R 13/645
439/61
5,273,462 A * 12/1993 Huser .................. H01R 13/645
439/341
(Continued)

FOREIGN PATENT DOCUMENTS

DE 29906583 U1 7/1999
EP 2829927 A1 1/2015

OTHER PUBLICATIONS

PCT Notification, International Search Report and Written Opinion, International Application No. PCT/EP2017/078128, dated Feb. 7, 2018, 12 pages.

*Primary Examiner* — Anthony M Haughton
(74) *Attorney, Agent, or Firm* — Barley Snyder

(57) ABSTRACT

A module arrangement for a modular field device connection unit comprises a frame module having an interface receptacle, an interface module adapted to be inserted into the interface receptacle along a module insertion path, and a resetting mechanism adapted to reset the movable coding element into the neutral position by insertion of the interface module into the interface receptacle and/or removal of the interface module from the interface receptacle. The interface module has a cartridge receptacle and a movable coding (Continued)

element. The movable coding element is movable from a neutral position into a coding position by insertion of a cartridge member into the cartridge receptacle. The resetting mechanism has a trigger element at least partially protruding into the module insertion path.

18 Claims, 4 Drawing Sheets

(51) Int. Cl.
*H05K 7/00* (2006.01)
*H05K 7/14* (2006.01)

(58) Field of Classification Search
CPC ...... H05K 7/14; H05K 7/1467; H05K 7/1471; H05K 7/1465; H05K 7/1464
See application file for complete search history.

(56) References Cited

U.S. PATENT DOCUMENTS

| | | | | |
|---|---|---|---|---|
| 5,402,320 | A * | 3/1995 | Kielstra | H01R 13/64 361/752 |
| 6,142,592 | A * | 11/2000 | Grittke | H01R 13/645 312/223.1 |
| 6,196,881 | B1 * | 3/2001 | Abert | H05K 7/1455 439/681 |
| 9,225,117 | B2 * | 12/2015 | Jacobsson | G05B 19/0423 |
| 9,716,343 | B2 * | 7/2017 | Wess | H01R 13/645 |
| 10,790,609 | B2 * | 9/2020 | Pakimo | H01R 25/006 |
| 2015/0017842 | A1 | 1/2015 | Jabobsson | |

* cited by examiner

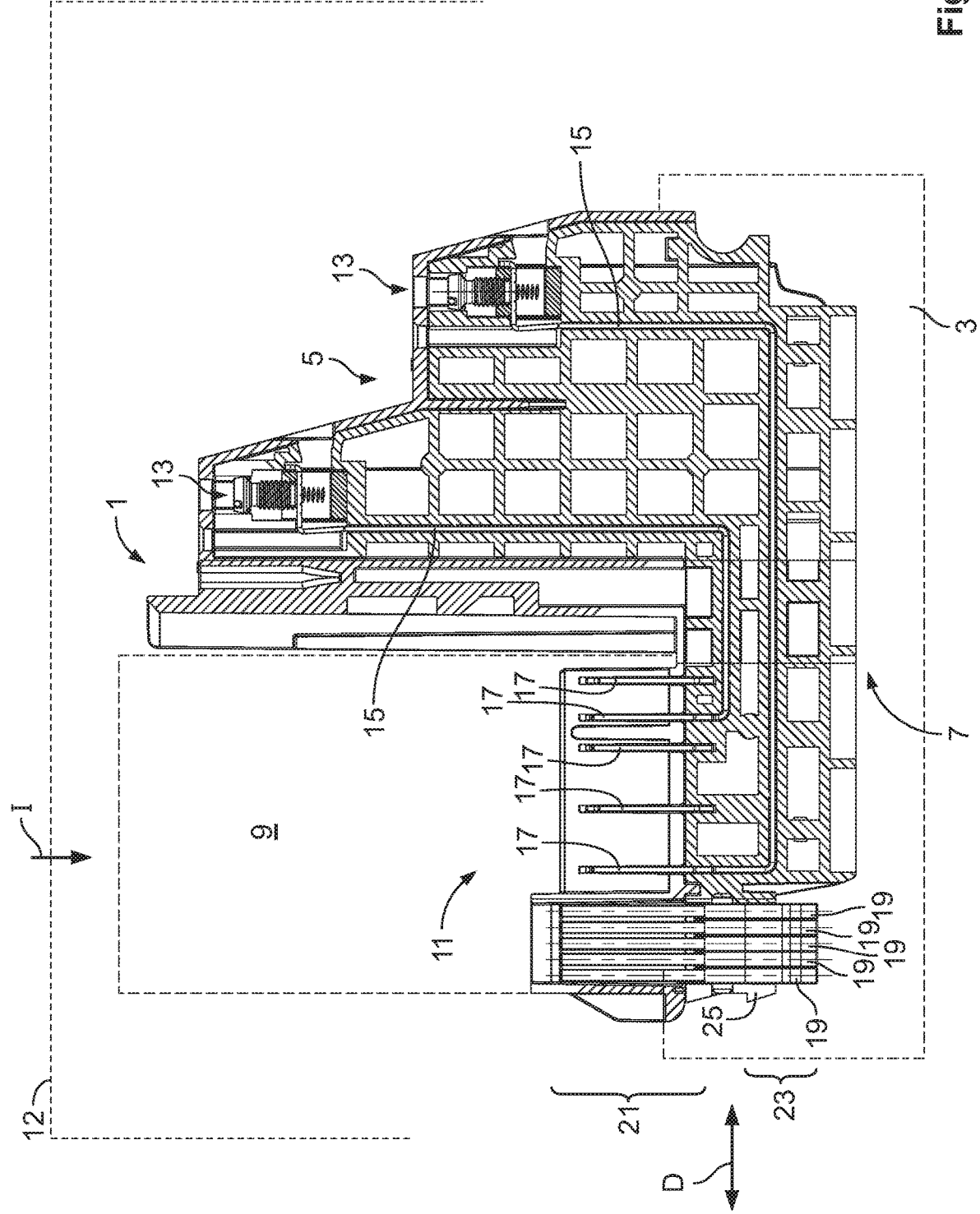

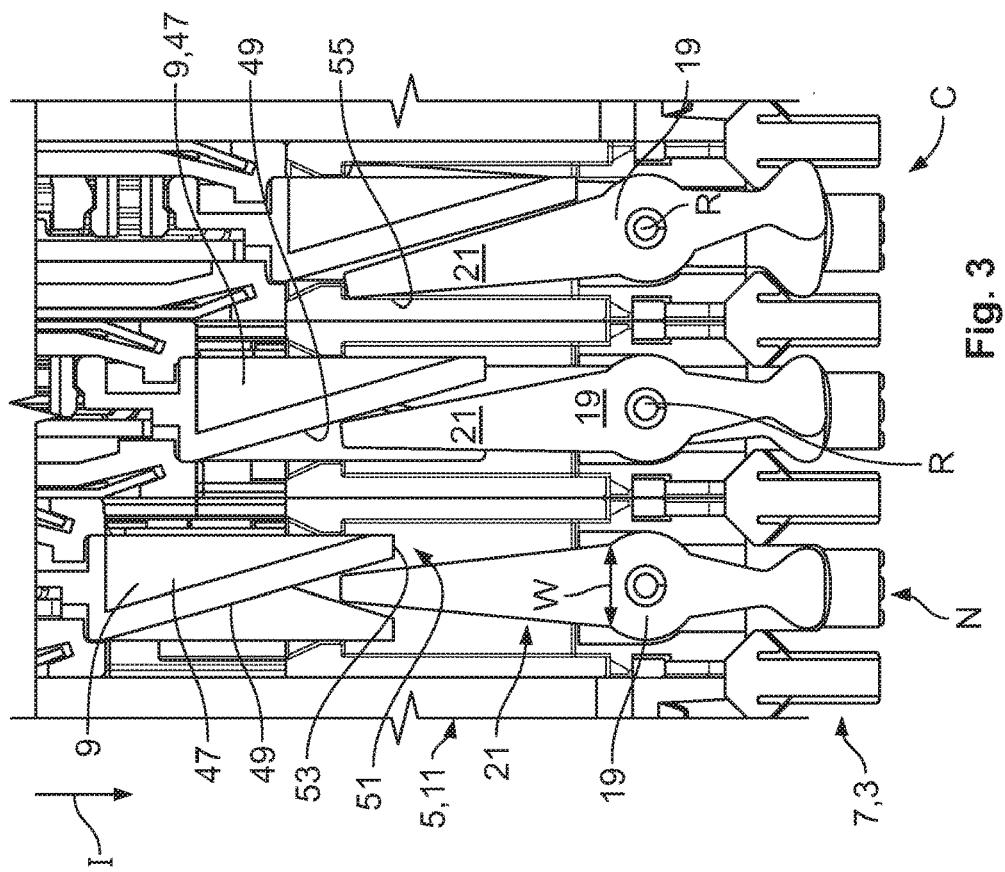
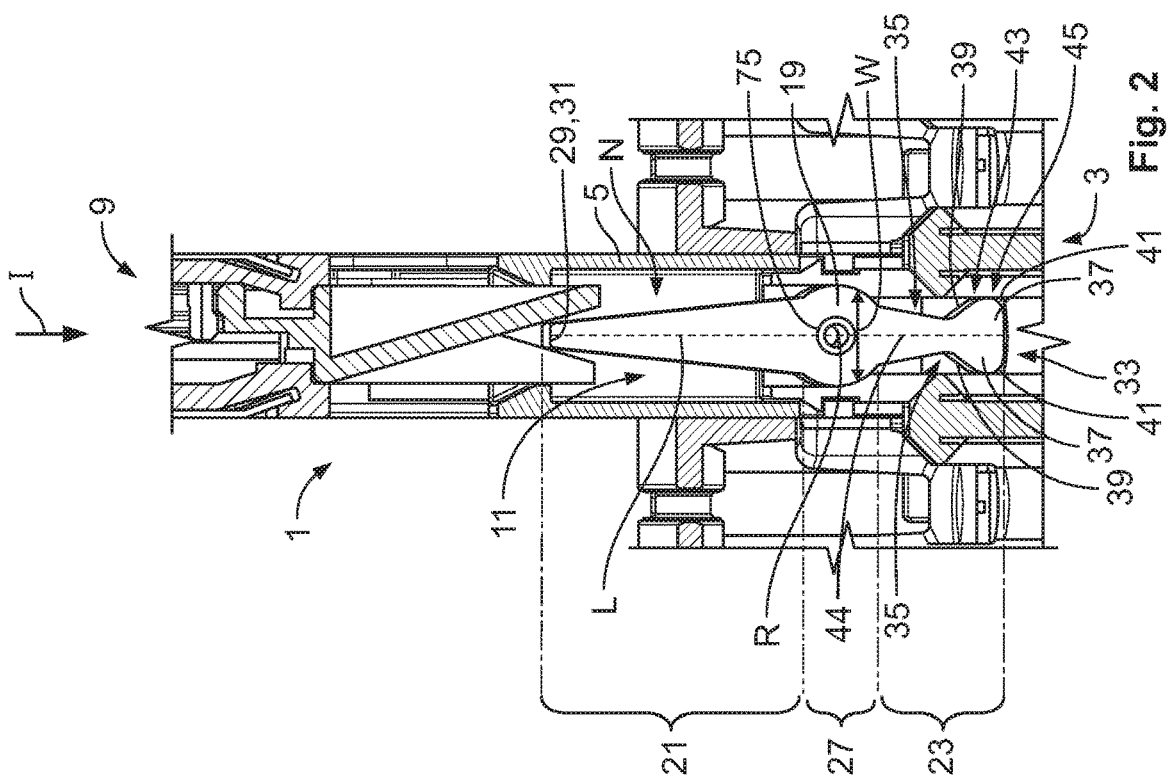

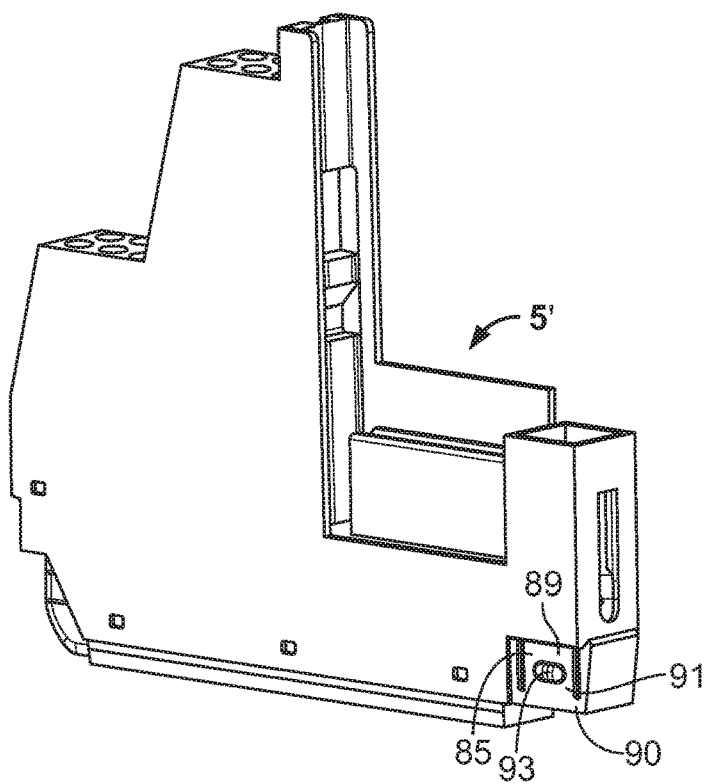
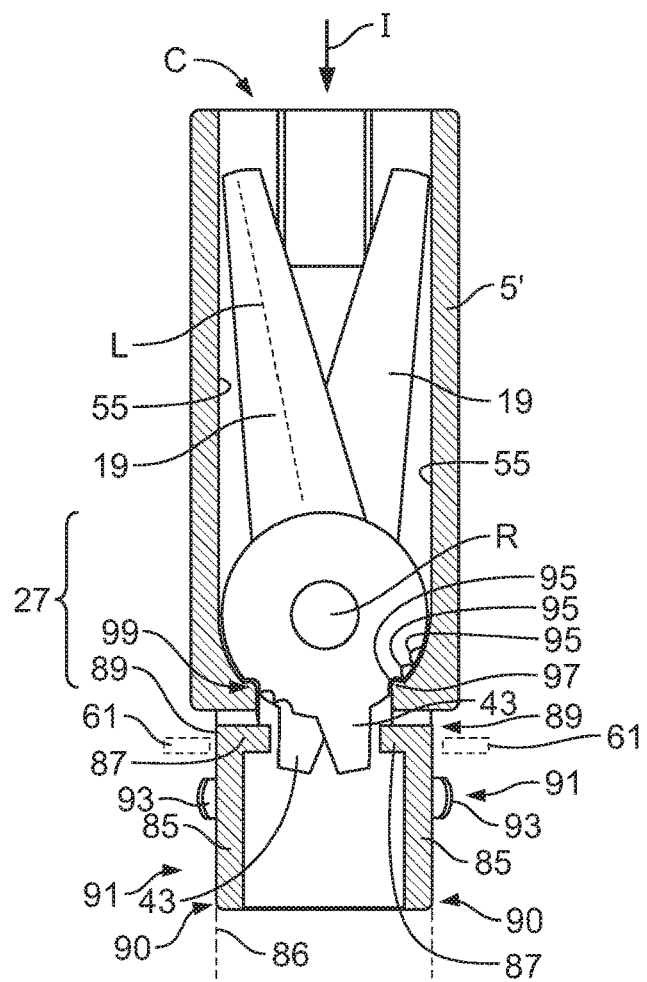
Fig. 6
Fig. 7

MODULE ARRANGEMENT WITH RESETTING MECHANISM

CROSS-REFERENCE TO RELATED APPLICATIONS

This application is a continuation of PCT International Application No. PCT/EP2017/078128, filed on Nov. 3, 2017, which claims priority under 35 U.S.C. § 119 to European Patent Application No. 16201446.8, filed on Nov. 30, 2016.

FIELD OF THE INVENTION

The present invention relates to a module arrangement for a modular field device connection unit and, more particularly, to module arrangement with a resetting mechanism.

BACKGROUND

Module arrangements for modular field device connection units are used for connecting field devices to other components, for example to a field bus system. A module arrangement with an interface module which is provided with movable coding elements is disclosed in EP 2829927. In EP 2829927, wedge-shaped immovable coding elements are adapted to move movable coding elements on a module into coding positions during insertion of a cartridge member into the interface module. Once arranged in coding positions, the movable coding elements prevent insertion of cartridge members with differently arranged immovable coding elements.

The solution described above is useful for a coding of interface modules to prevent the insertion of a wrong cartridge member into a cartridge receptacle. This solution, however, does not provide a solution for moving the movable coding element back into a neutral position. If this task is performed manually, it is complicated and time-consuming.

SUMMARY

A module arrangement for a modular field device connection unit comprises a frame module having an interface receptacle, an interface module adapted to be inserted into the interface receptacle along a module insertion path, and a resetting mechanism adapted to reset the movable coding element into the neutral position by insertion of the interface module into the interface receptacle and/or removal of the interface module from the interface receptacle. The interface module has a cartridge receptacle and a movable coding element. The movable coding element is movable from a neutral position into a coding position by insertion of a cartridge member into the cartridge receptacle. The resetting mechanism has a trigger element at least partially protruding into the module insertion path.

BRIEF DESCRIPTION OF THE DRAWINGS

The invention will now be described by way of example with reference to the accompanying Figures, of which:

FIG. 1 is a sectional top view of an interface module according to an embodiment;

FIG. 2 is a sectional top view of the interface module of FIG. 1 in a region of a movable coding element;

FIG. 3 is a top view of an insertion of a cartridge member into the interface module of FIG. 1 and a coding process;

FIG. 6 is a perspective view of an interface module according to another embodiment; and FIG. 7 is a sectional top view of the interface module of FIG. 6 in a region of a movable coding element.

DETAILED DESCRIPTION OF THE EMBODIMENT(S)

Figure 4:
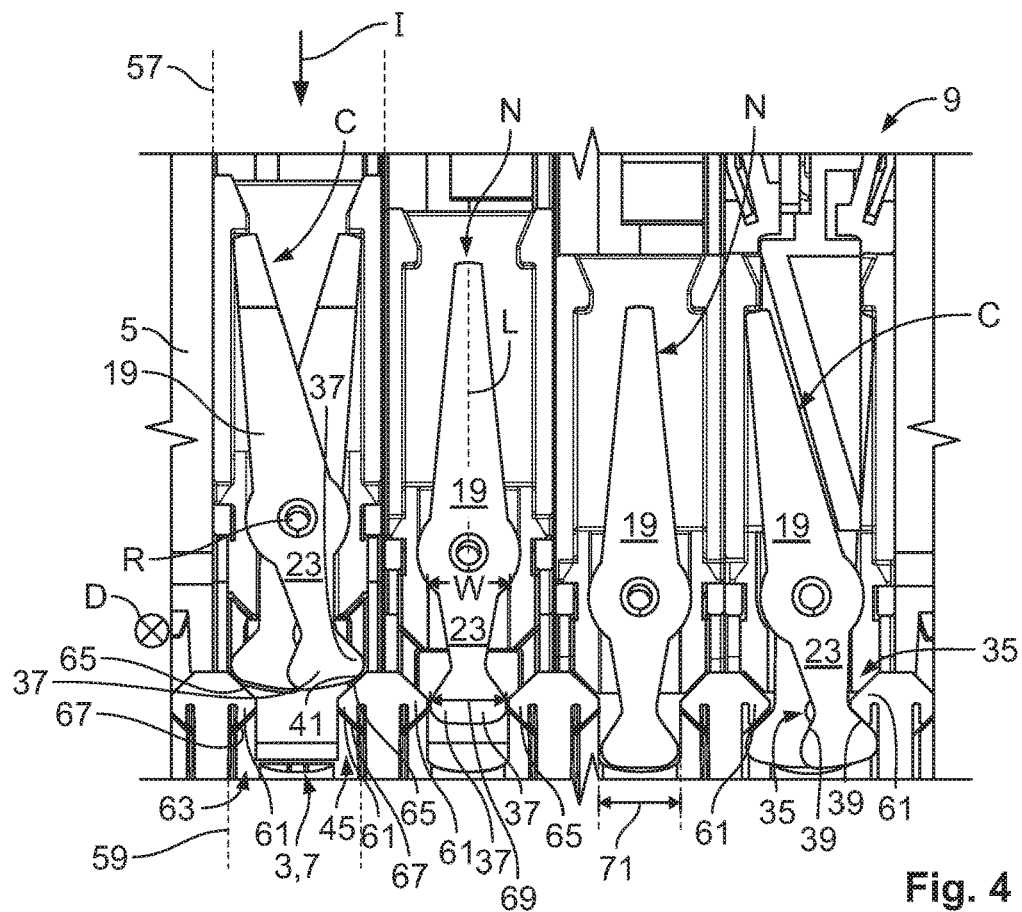
FIG. 4 is a top view of a resetting process of the interface module of FIG. 1.

In the following, the invention is described in greater detail using exemplary embodiments with reference to the drawings. The various features shown in the embodiments may be used independently of each other in specific applications. In the following figures, elements having the same function and/or the same structure will be referenced by the same reference signs.

An interface module 5 according to an embodiment and its function in a module arrangement 1 according to the invention will be described with reference to FIG. 1. Coding and resetting are described further below with respect to the following figures.

The module arrangement 1, as shown in FIG. 1, comprises a frame module 3 and at least one interchangeable interface module 5 which is insertable into an interface receptacle 7 of the frame module 3. The module arrangement 1 and at least one cartridge member 9, which is insertable into a cartridge receptacle 11 of the interface module 5, together are part of a modular field device connection unit 12.

As shown in FIG. 1, the module arrangement 1 comprises a plurality of interface receptacles 7 in the frame module 3, a plurality of interface modules 5 and may further comprise none or any number of cartridge members 9. However, for the sake of clarity and brevity, the structure and the function of the individual features are described with respect to a single interface module 5 in the following.

The module arrangement 1 can be used for connecting field devices to a field bus system. The field bus system can be connected to the frame module 3 such that an interface module 5 may also be electrically connected to the field bus. In an embodiment, the frame module 3 and/or the interface module 5 may be connected to at least one DIN rail of a field bus system.

For connecting field devices to the module arrangement 1, the interface module comprises a plurality of field device connection elements 13 shown in FIG. 1. The field device connection elements 13 are electrically connected via conductors 15 to electric contacts 17. The electric contacts 17 are arranged in the cartridge receptacle 11 and are adapted for being electrically contacted to complementary contacts in the cartridge member 9. In this way, the output of the field device connection elements 13 can be controlled via an inserted cartridge member 9. Each cartridge member 9 in an embodiment comprise electric circuits, electric components, or further connection elements for additional connections to other components.

As shown in FIG. 1, the cartridge member 9 is insertable along an insertion direction I into the cartridge receptacle 11. In an embodiment, the interface module 5 is insertable along the same direction I into the interface receptacle 7.

The interface module 5, as shown in FIG. 1, has a plurality of movable coding elements 19. The movable coding elements 19 are arranged adjacent to each other along a depth direction D of the interface module 5. Each movable coding element 19 has a coding section 21 and a resetting section 23. The movable coding elements 19 extend essentially parallel with the insertion direction I; the coding section 21 is aligned towards the cartridge receptacle 11 and the resetting section 23 is aligned towards the interface receptacle 7. The coding section 21 of each movable coding element 19 is intended for interacting with the cartridge member 9 for being coded, whereas the resetting section 23 is intended for interacting with the resetting mechanism of the module arrangement 1. The movable coding elements 19 at least partially protrude out of a housing 25 of the interface module 5 along the insertion direction I such that interaction with a resetting mechanism, which is at least partially arranged in the frame module 3 in an embodiment, is possible.

A movable coding element 19 will now be described with respect to FIG. 2.

Subsequently, the coding function during insertion of a cartridge member 9 into the cartridge receptacle 11 will be described with respect to FIG. 3.

In FIG. 2, the interface module 5 is shown with one movable coding element 19, a part of a cartridge member 9 in a not fully inserted state in the cartridge receptacle 11, and parts of the frame module 3. FIG. 2 shows the module arrangement 1 in a view which is rotated around 90° around the insertion direction I with respect to the view of FIG. 1.

As shown in FIG. 2, the movable coding element 19 has an overall longitudinal shape which extends along a longitudinal axis L of the coding element 19. The longitudinal axis L is essentially parallel with the insertion direction I when the movable coding element 19 is in the neutral position N shown in FIG. 2. In an embodiment, the movable coding element 19 is formed mirror-symmetrically with respect to the longitudinal axis L.

The movable coding element 19, as shown in FIG. 2, comprises a mounting section 27 at which it is mounted in a movable manner to the interface module 5. The mounting section 27 is arranged between the coding section 21 and the resetting section 23 along the longitudinal axis L. The mounting section 27 separates the coding section 21 and the resetting section 23. In the mounting section 27, the movable coding element 19 is held rotatably around an axis of rotation R. The axis of rotation R is arranged perpendicular to the longitudinal axis L. Details of the mounting of the movable coding elements 19 to the interface module 5 are later described with respect to FIG. 5.

As shown in FIG. 2, in the coding section 21, the movable coding element 19 tapers from the mounting section 27 towards a free end 29. In the free end 29, the movable coding element 19 has a stop surface 31. The stop surface 31 extends essentially perpendicular to the longitudinal axis L. In other embodiments, this shape may vary. In an embodiment, the stop surface 31 may have an overall convex shape such that a portion of the stop surface 31 is perpendicular to the insertion direction I when the movable coding element 19 is in one of the coding positions.

The movable coding element 19 has a through hole 75 in the mounting section 27 for mounting the movable coding element 19 in a rotatable manner, as shown in FIG. 2. In order to maintain the stability of the movable coding element 19, the width of the movable coding element 19 which is measured along a width direction W is greatest in the mounting section 27. The width direction W extends perpendicular to the longitudinal axis L. As described above with respect to the tapering of the movable coding element 19 in the coding section 21, the width measured in the width direction W decreases from the mounting section 27 towards the free end 29.

In the resetting section 23, as shown in FIG. 2, the width of the movable coding element 19 initially decreases starting from the mounting section 27 towards a free end 33 of the movable coding element 19, and, afterwards increases again, in such a way that two recesses 35 are formed in the movable coding element 19 in the resetting section 23 which lie opposite to each other across the longitudinal axis L. The recesses 35 do not interfere with a resetting mechanism during coding of the element 19 when the interface module 5 is inserted in the frame module 3.

As shown in FIG. 2, the width of the movable coding element 19 increases towards its free end 33 by two arms 37 which extend from the remaining movable coding element 19 in the width direction W on both sides of the longitudinal axis L. Each arm 37 comprises a proximal sloped surface 39 with which the width of the movable contact element 19 decreases from a region in which the arm 37 has its largest extension along the width direction W in the direction of the mounting section 27. Each arm 37 has a distal sloped surface 41 with which the width of the movable coding element 19 decreases from the above-mentioned region where the arm 37 has its largest extension in the width direction W towards the free end 33.

With both arms 37, each comprising a proximal sloped surface 39 and a distal sloped surface 41, the region of the resetting section 23 which is provided with the arms 37 has an overall anvil-like shape. In order to allow smooth insertion of the interface module 5 into the frame module 3 and removal thereof, the transition between a proximal sloped surface 39 and a distal sloped surface 41 is smooth such that curved contours are formed.

The arms 37 are arranged on an extension 43 of the movable coding element 19 as shown in FIG. 2. The extension 43 essentially forms the resetting section 23. The arms 37 are arranged on a distal end of the extension 43 which is arranged closer to the free end 33 than to the mounting section 27. The extension 43 may work as a lever for the movable coding element 19. The extension 43 extends longitudinally along a longitudinal direction 44 parallel with the longitudinal direction L of the movable coding element 19.

A force which acts perpendicular to the longitudinal axis L on the extension 43 will result in a rotational movement of the movable coding element 19 around the axis of rotation R and, consequently, in pivoting of the coding section 21. The extension 43 together with the arms 37 and their sloped surfaces 39 and 41 are a part of the resetting mechanism 45, which is described in detail with respect to FIG. 4 below.

The coding process of the movable coding element 19 will now be described with respect to FIG. 3. In FIG. 3, three different positions of the movable coding element 19 are shown. FIG. 3 shows an frame module 3 with a plurality of interface receptacle 7, wherein an interface module 5 is inserted in each interface receptacle 7. Into each interface module 5 in FIG. 3, a cartridge member 9 is inserted, wherein each cartridge member 9 is shown in a different state of insertion. Since the interface modules 5 are identical, the insertion process is described in the following by using each pair of interface module 5 and cartridge member 9 as representatives of a certain state of insertion.

Starting from the left in FIG. 3, the first movable coding element 19 is in the neutral position N as already shown in FIG. 2. The movable coding element 19 in the middle in FIG. 3 is shown in an intermediate state during movement from the neutral position N into the coding position C, which is shown on the right side of FIG. 3.

Starting from the left in the neutral position N, the interface module 5 is seated in the interface receptacle 7 of the frame module 3. The coding section 21 extends parallel to the insertion direction I of a cartridge member 9. The cartridge member 9 has at least one, and in an embodiment, a plurality of immovable coding elements 47. Each immovable coding element 47 is provided with an inclined surface 49 which is inclined with respect to the insertion direction I. Each immovable coding element 47 has an overall wedge-like shape. A free end 51 of each immovable coding element 47 has a stop surface 53, which extends essentially perpendicular to the insertion direction I.

In the embodiment shown in FIG. 3, the cartridge member 9 has the same number of immovable coding elements 47 as the number of movable coding elements 19 provided on the interface module 5. Each free end 51 of an immovable coding element 47 is arranged such that it takes a position beside the free end 29 of the movable coding element 19 in the beginning of the insertion of the cartridge member 9 in the case that the movable coding element 19 is in the neutral position N. In this situation, which is shown on the left in FIG. 3, the inclined surface 49 of the immovable coding element 47 overlaps with at least the free end 29 of the movable coding element 19 seen in the insertion direction I.

Further insertion of the cartridge member 9 into the cartridge receptacle 11 of the interface module 5 results in moving the movable coding element 19 out of the neutral position N. This situation is shown in the middle of FIG. 3. The immovable coding element 47 is pushed along the movable coding element 19 such that the inclined surface 47 pushes the coding section 21 out of the neutral position N. The movable coding element 19 thereby rotates around the axis of rotation R.

When the cartridge member 9 is fully inserted in the cartridge receptacle 11, the immovable coding element 47 has moved the coding section 21 of the movable coding element 19 such that the movable coding element 19 is in the coding position C, shown on the right side of FIG. 3. In the coding position C, the coding section 21 abuts an inner wall 55 of the interface module 5.

The coding position C is, as the neutral position N, a stable position; if a cartridge member 9 and/or a resetting mechanism 45 are not exceeding force on the movable coding element 19, the element 19 will remain in its position. In an embodiment, the movable coding element 19 and the interface module 5 form a bi-stable system. In an embodiment two different coding positions C are possible for a single movable coding element 19, and the movable coding element 19 may be a tri-stable system.

After removal of the cartridge member 9, the coding elements 19 remain in their coding position C. If it is intended to insert a cartridge member 9 again, then only a cartridge member 9 which comprises similarly arranged immovable coding elements 47 is allowed to be inserted in the cartridge receptacle 11. If, for example, a cartridge member 9 is to be inserted which has differently arranged immovable coding elements 47, then the stop surfaces 53 of the differently arranged immovable coding elements 47 will abut the stop surfaces 31 of the movable coding elements 19 during or before insertion of the cartridge member 9 into the cartridge receptacle 11.

The resetting mechanism 45 and its functions will be described in detail with respect to FIG. 4. The process of resetting the movable coding elements 19 of an interface module 5 is described during insertion of an interface module 5 into the interface receptacle 7 of a frame module 3. This is shown again from left to right in FIG. 4. The interface module 5 shown in FIG. 4 is identical to the interface module 5 as shown in FIG. 3 and is arranged in the same coding position C as on the right side of FIG. 3.

In the following, the structure of the resetting mechanism 45 is described. Afterwards, the function of the resetting mechanism 45 is described. For the sake of clarity, only the structure of a single resetting mechanism 45 and a single interface module 5 and the related components is described.

The interface module 5 is insertable along a module insertion path 57 into the interface receptacle 7 of the frame module 3, as shown in FIG. 4. The module insertion path 57 can be defined by guiding elements on the frame module 3. In an embodiment, the module insertion path 57 extends parallel to the insertion direction I of the cartridge member 9 into the interface module 5 which is also the direction of insertion I of an interface module 5 into the interface receptacle 7. A portion of the module insertion path 57 through which the movable coding element 19 is moved during insertion of the interface module 5 into the frame module 3 is formed by an insertion path 59 of the movable coding element 19.

As shown in FIG. 4, the resetting mechanism 45 comprises, in addition to the arms 37 on the movable coding element 19, two trigger elements 61 which are formed on the frame module 3 and which protrude into the insertion path 59 of the movable coding element 19 and therefore also in the module insertion path 57. In an embodiment, the trigger elements 61 are monolithically formed with the frame module 3. The two trigger elements 61 are arranged opposite each other across the module insertion path 57 and arranged at the same height along the insertion direction I. The two trigger elements 61 form a pair 63 of trigger elements 61.

In an embodiment, the module arrangement 1 comprises one pair 63 for at least one movable coding element 19. In another embodiment, the module arrangement 1 comprises one pair 63 of trigger elements 61 for the plurality of movable coding elements 19. Each trigger element 61 may extend along the depth direction D which is perpendicular to the insertion direction I and to the width direction W of a movable coding element 19 in the neutral position N. In other words, the depth direction D is the direction in which the movable coding elements 19 of an interface module 5 are arranged adjacent to each other.

Each trigger element 61, as shown in FIG. 4, has two guiding surfaces 65 and 67. The guiding surface 65 extends in the insertion direction I and towards the opposite trigger element 61. The guiding surface 67 extends against the insertion direction I and towards the opposite trigger element 61. In an embodiment, each guiding surface 65 and 67 is inclined at an angle between 30 and 60 degrees with respect to the insertion direction I.

In the following, the resetting function of the resetting mechanism 45 is described with respect to FIG. 4. Also here, the function is described with respect to a single movable contact element 19 only for the sake of brevity and clarity. However, the same function can be applied to the plurality of movable coding elements 19 of the interface module 5 and applies to all movable coding elements 19 at the same time during resetting.

As described above, the left side of FIG. 4 shows a movable coding element 19 in the coding position C. During insertion of the interface module 5 into the interface receptacle 7, the resetting section 23 of the movable coding element 19 abuts one of the trigger elements 61.

Because the resetting mechanism 45 has two trigger elements 61, it does not matter to which of the two coding positions C the movable coding element 19 is pivoted since the resetting section 23 will always overlap with one of the trigger elements 61 in the insertion direction I. Because the trigger elements 61 protrude into the insertion path 59, the resetting section 23 collides with one of the trigger elements 61.

In FIG. 4, the trigger elements 61 on the right side collide with the resetting section 23 of the movable coding element 19. Contact is made between the distal sloped surface 41 of the arm 37 and the guiding surface 65 of the trigger element 61. During further insertion of the interface module 5 into the interface receptacle 7, the arm 37 slides along the guiding surface 65 such that a force is applied on the resetting section 23, causing the resetting section 23 to move closer to the center of the insertion path 59. The movable coding element 19 rotates around the axis of rotation R causing the movable coding element 19 to move back towards the neutral position N.

In the next stage, which is shown in the second part of FIG. 4, starting from the left, the arms 37 of the movable coding element 19 in the resetting section 23 are arranged between the two opposite trigger elements 61. Thereby, a maximum width 69 of the movable coding element 19 in the resetting section 23, which is measured along the width direction W, is identical or slightly lower than the minimal distance 71 between the two opposite trigger elements 61. Insertion of the resetting section 23, at least the region with the maximum width 69 between the two opposite trigger elements 61, guarantees that the resetting section 23 is centered between the two trigger elements 61 such that the longitudinal axis L of the movable coding element 19 is arranged parallel to the insertion direction I and thereby situated in the neutral position N. Thus, the movable coding element 19 is reset.

In the third part of FIG. 4, starting from the left, the interface module 5 is fully inserted in the frame module 3. Since the movable coding element 19 is not movable without a force being applied on it from a resetting mechanism 45 or a cartridge member 9, the movable coding element 19 maintains the neutral position N. The movable coding element 19 is automatically reset during insertion of the interface module 5 into the frame module 3 and/or removal of the interface module 5 therefrom. The resetting does not require manually moving back the movable coding element 19 into the neutral position N, which allows the resetting without the need for extra tools. The resetting can be pre-formed without the need to remove cables which can be connected to the interface module 5, for example cables for connecting field devices.

In the following, the movable coding element 19 can be used for coding again by inserting a cartridge member 9. This is shown in the rightmost part of FIG. 4. The coding can be performed as previously described with respect to FIG. 3. In the coding position C, the trigger element 61, which comes closest to the resetting section 23 of the movable coding element 19 can be received in the recess 35 such that it will not interact with the resetting section 23 and will not apply a force on the movable coding element 19 which would cause the element 19 to move back to the neutral position N.

In the coding position C, one of the proximal sloped surfaces 39 can abut one of the trigger elements 61 and can be in direct contact with one of the guiding surfaces 67. This abutment can help to support the movable coding element 19 when one attempts to insert a differently coded cartridge member 9. The abutment helps to keep the movable coding element 19 in the coding position C.

It should also be noted that the movable coding element 19 can also be moved back from the coding position C to the neutral position N during removal of the interface module 5 from the frame module 3. In this case, one of the proximal sloped surfaces 39 of the movable coding element 19 will collide with one of the guiding surfaces 67 causing the movable coding element 19 to move back into the neutral position N.

Figure 5:
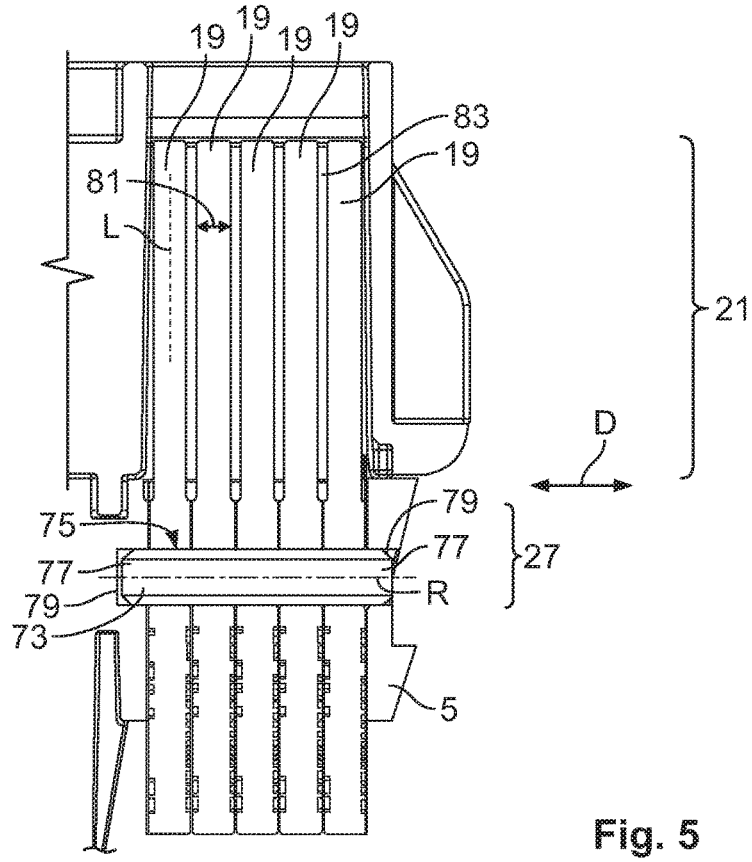
FIG. 5 is a sectional side view of a plurality of movable coding elements of the interface module of FIG. 1 arranged on a pin.

As shown in FIG. 5, a plurality of movable coding elements 19 are arranged such that they are arranged adjacent to each other along the depth direction D. In the mounting section 27, each movable coding element 19 is rotatably mounted on a pin 73 which extends along the axis of rotation R. The pin 73 penetrates through each movable coding element 19 in the mounting section 27. Each movable coding element 19 is provided with a through-hole 75 which extends to the movable coding element 19 along the depth direction D such that the pin 73 can be inserted in the through-hole 75. The pin 73 is kept in the interface module 5 by press-fit wherein the opposite ends of ends 77 of the pin 73 are pressed in complementary openings 79 in the interface module 5. The movable coding elements 19 are rotatably mounted on the pin 73.

The movable coding elements 19 are mounted on the pin 73 such that they can be rotated around the axis of rotation R only when a predefined force is exceeded. Thus, the movable coding elements 19 cannot be moved by gravitational force or typical low vibrations which may occur during transport.

The frictional force between the movable coding elements 19 in the mounting section 27 and the pin 73 allows the movable coding elements 19 to remain in one of the coding positions C or the neutral position N. In the coding section 21, the movable coding element 19 may have a thickness 81 which is lower than a thickness in the mounting section 27. Due to the reduced thickness in the coding section 21, gaps 83 are formed between two adjacent movable coding elements 19 in the region of the coding sections 21. These gaps 83 prevent interaction of two adjacent movable coding elements 19 with each other.

An interface module 5' according to another embodiment is shown in FIGS. 6 and 7. In the embodiment as described above with respect to FIGS. 1-5, the resetting sections 23 of the movable coding elements 19 protrude out of the interface module 5. This may be useful for easily resetting the coding elements 19. However, if for example protection of the movable coding elements 19 is sought, then the second embodiment of the interface module may be helpful. In the second embodiment of the interface module 5', as shown in FIGS. 6 and 7, each movable coding element 19 is provided with an extension 43 that is not provided with arms 37. In another embodiment, the extensions 43 of the second embodiment may be provided with the arms 37.

The interface module 5', as shown in FIGS. 6 and 7, has a pair of elastically deflectable pusher members 85. The pusher members 85, in an embodiment, are formed monolithically with the interface module 5'. The pusher members 85 are arranged opposite each other with the extensions 43 of the resetting sections 23 of the movable coding elements 19 between them. The pusher members 85 are elastically deflectable towards each other.

If a movable coding element 19 is arranged in a coding position C, as shown in FIG. 7, then deflecting the pusher members 85 towards each other will result in resetting the movable coding element 19 into the neutral position N again. During deflection of both pusher members 85, the space between both pusher members 85 narrows such that the extension 43 will collide with at least one of the pusher members 85 and move into the center between both pusher members 85.

When the interface module 5' is inserted along the module insertion path 57, the pusher members 85 are inserted along an insertion path 86 shown in FIG. 7 which is part of the module insertion path 57. Both pusher members 85 are formed with protrusions 87 which protrude towards each other at the height of the extensions 43. When both pusher members 85 are deflected towards each other, then the protrusions 87 may collide with the extensions 43 to bring the movable coding elements 19 back into the neutral position. The protrusions 87 are arranged on elastically deflectable free ends 89 of the pusher members 85 which are arranged on opposite sides of the basis 90 of the pusher elements 85 at which the pusher elements 85 are immovably connected with the remaining interface module 5'. Each basis 90 is arranged opposite the protrusions 87 seen parallel with the insertion direction I.

On outer sides 91 of the pusher members 85 facing away from each other, the pusher members 85 are provided with outer protrusions 93, as shown in FIG. 7. Each outer side 91 is provided with one outer protrusion 93. The outer protrusion 93 may be arranged in a region between the free end 89 and the base 90 along the insertion direction I.

Each outer protrusion 93 has a convex cross section seen in the direction of the rotational axis R. The outer protrusions 93 are intended for interacting with trigger elements 61 of the frame module 3, shown in FIG. 7. The trigger elements 61 are indicated in a position in which they would interact with the outer protrusions 93 during removal of the interface module 5' from the frame module 3. As in the interface module 5 described with respect to FIGS. 1-5, upon insertion and/or removal of the interface module 5' into or from a frame module 3, the trigger elements 61 are arranged in the module insertion path 57. When the trigger elements 61 collide with the outer protrusions 93, the pusher members 85 will be deflected towards each other crossing a movement of the movable coding elements 19 from a coding position C into the neutral position N.

In the mounting section 27, the movable coding elements 19 of the second embodiment are provided with a plurality of recesses 95 on each side opposite to the longitudinal axis L, as shown in FIG. 7. The interface module 5' is, on each inner wall 55, provided with a nose 97 which is formed complementary to the recesses 95.

The recesses 95 and the noses 97 on each side of the movable coding element 19 form a form fit arrangement 99 which is formed as ratchet arrangement 99, as shown in FIG. 7. The ratchet arrangement 99 is adapted to keep the movable coding element 19 in the coding position C or the neutral position N. The ratchet arrangement 99 may be adapted for maintaining the position of the movable coding element 19 as long as a force on the movable coding element 19 does not exceed a predefined value. The arrangement 99 may be adapted such that the movable coding elements 19 are only moved during insertion of the interface module 5 into a frame module 3 or removal thereof and/or during insertion of a cartridge member 9 in the case that the movable coding elements 19 are in the neutral position N prior to insertion of the cartridge member 9.

What is claimed is:

1. A module arrangement for a modular field device connection unit, comprising:
 a frame module having an interface receptacle;
 an interface module adapted to be inserted into the interface receptacle along a module insertion path, the interface module having a cartridge receptacle and a movable coding element, the movable coding element is movable from a neutral position into a coding position by insertion of a cartridge member into the cartridge receptacle; and
 a resetting mechanism adapted to reset the movable coding element into the neutral position by insertion of the interface module into the interface receptacle and/or removal of the interface module from the interface receptacle, the resetting mechanism having a trigger element at least partially protruding into the module insertion path.

2. The module arrangement of claim 1, wherein the trigger element partially protrudes into an insertion path of the movable coding element.

3. The module arrangement of claim 2, wherein the insertion path of the movable coding element is part of the module insertion path.

4. The module arrangement of claim 1, wherein the resetting mechanism has a pair of trigger elements arranged opposite each other across the module insertion path.

5. The module arrangement of claim 1, wherein the trigger element is arranged on the frame module and has a guiding surface for the movable coding element.

6. The module arrangement of claim 5, wherein the guiding surface is inclined with respect to a module insertion direction of the interface module into the interface receptacle.

7. The module arrangement of claim 1, wherein the interface module has a deflectable pusher member.

8. The module arrangement of claim 7, wherein the trigger element is arranged on the frame module and protrudes into an insertion path of the pusher member.

9. The module arrangement of claim 8, wherein the pusher member is elastically deflectable toward the movable coding element.

10. The module arrangement of claim 1, wherein the neutral position and the coding position are stable positions of the movable coding element with respect to the interface module.

11. The module arrangement of claim 10, wherein the movable coding element is kept in at least one of the neutral position and the coding position by a frictional force.

12. The module arrangement of claim 10, wherein the movable coding element is kept in at least one of the neutral position and the coding position by a ratchet arrangement.

13. The module arrangement of claim 1, wherein the movable coding element has a coding section adapted to interact with a complementary coding element of the cartridge member and a resetting section adapted to interact with the trigger element.

14. The module arrangement of claim 13, wherein the resetting mechanism has an extension on the movable coding element, the extension forming the resetting section.

15. The module arrangement of claim 14, wherein the extension has an arm adapted to interact with the trigger element and extending perpendicular to a longitudinal direction of the extension.

16. A modular field device connection unit, comprising:
 a module arrangement including a frame module having an interface receptacle, an interface module adapted to be inserted into the interface receptacle along a module insertion path, the interface module having a cartridge receptacle and a movable coding element, and a resetting mechanism adapted to reset the movable coding element into a neutral position by insertion of the interface module into the interface receptacle and/or removal of the interface module from the interface receptacle, the resetting mechanism having a trigger element at least partially protruding into the module insertion path.

17. The modular field device connection unit of claim 16, further comprising a cartridge member having an immovable coding element with an inclined surface.

18. The modular field device connection unit of claim 17, wherein the cartridge member is adapted to move the movable coding element from the neutral position into a coding position by insertion of the cartridge member into the cartridge receptacle.

* * * * *